United States Patent
Maehara

(10) Patent No.: US 9,461,082 B2
(45) Date of Patent: Oct. 4, 2016

(54) SOLID STATE IMAGING APPARATUS AND METHOD OF PRODUCING THE SAME

(71) Applicant: Sony Corporation, Tokyo (JP)

(72) Inventor: Masataka Maehara, Oita (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/330,270

(22) Filed: Jul. 14, 2014

(65) Prior Publication Data

US 2015/0021729 A1    Jan. 22, 2015

(30) Foreign Application Priority Data

Jul. 19, 2013  (JP) ................................ 2013-150480

(51) Int. Cl.
*H01L 31/0232* (2014.01)
*H01L 27/146* (2006.01)
*H01L 31/0203* (2014.01)
*H01L 23/00* (2006.01)

(52) U.S. Cl.
CPC ......... *H01L 27/14625* (2013.01); *H01L 24/05* (2013.01); *H01L 27/14618* (2013.01); *H01L 27/14634* (2013.01); *H01L 31/0203* (2013.01); *H01L 2224/04042* (2013.01); *H01L 2224/48463* (2013.01)

(58) Field of Classification Search
None
See application file for complete search history.

(56) References Cited

U.S. PATENT DOCUMENTS

2012/0208697 A1* 8/2012 Yamaguchi .............. B41M 5/41
                                                    503/201

FOREIGN PATENT DOCUMENTS

JP         2007-067317        3/2007

* cited by examiner

*Primary Examiner* — Sonya D McCall Shepard
(74) *Attorney, Agent, or Firm* — Michael Best & Friedrich LLP

(57) ABSTRACT

There is provided a solid state imaging apparatus, including: an optical film layer on which a solid state image sensor is mounted; a multifunctional chip laminated at a periphery of the solid state image sensor in the optical film layer being electrically contacted with the optical film layer via a metal body; a sealing resin layer for sealing the periphery where the multifunctional chip is laminated on the optical film layer; and a concave structure for blocking a flow of the sealing resin in a liquid state when the sealing resin layer is formed at the periphery of the sealing resin layer. Also, a method of producing the solid state imaging apparatus is also provided.

15 Claims, 8 Drawing Sheets

SOLID STATE IMAGING APPARATUS AND METHOD OF PRODUCING THE SAME

CROSS REFERENCE TO RELATED APPLICATIONS

This application claims the benefit of Japanese Priority Patent Application JP 2013-150480 filed Jul. 19, 2013, the entire contents of which are incorporated herein by reference.

BACKGROUND

The present technology relates to a solid state imaging apparatus and a method of producing the solid state imaging apparatus. More particularly, the present technology relates to a solid state imaging apparatus and a method of producing the solid state imaging apparatus having a small chip size and improved optical properties.

SUMMARY

In the related art, a semiconductor apparatus is produced by electrically connecting circuits being laminated on a chip, and sealing the connection with a sealing resin agent.

Japanese Patent Application Laid-open No. 2007-067317 proposes the technology that a convex structure for blocking a flow of a sealing resin to peripheries of circuits being laminated on a chip is disposed to form a dam structure, whereby a flow of unnecessary resin to the peripheries is blocked when the sealing resin is applied.

In the meantime, a solid state imaging apparatus is configured by a solid state image sensor as an optical film layer and a variety of circuits therearound. In order to improve functionality, a much wider flat space is necessary as the circuit configuration is complex. However, the wider surface around the solid state image sensor in the circuit configuration may grow in size of the solid state image sensor.

Therefore, it has been proposed that a multifunctional chip is laminated around the solid state image sensor on the optical film layer and the multifunctional chip is sealed with a sealing resin, thereby decreasing the flat space needed around the solid state image sensor and providing a small-sized solid state imaging apparatus having an improved functionality.

As described in Japanese Patent Application Laid-open No. 2007-067317, the convex structure for blocking a flow of the sealing resin is disposed to form the dam structure, whereby damming the sealing resin. However, a flat space for disposing the convex structure for blocking a flow of the sealing resin is necessary and is an obstacle to provide a small-sized solid state imaging apparatus.

In addition, as the convex structure for blocking a flow of the sealing resin is disposed in the space at the periphery of an optical pixel region, a stray light is generated by being reflected at the convex structure for blocking a flow of the sealing resin. An incident light including the stray light reflected is received at the optical pixel region, which may result in a decreased image quality.

It is therefore desirable not to decrease an image quality of a captured image by forming a concave scoop portion instead of the convex structure for blocking a flow of the sealing resin, thereby decreasing a necessary space around the solid state image sensor and inhibiting a generation of the stray light reflected.

According to an embodiment of the present technology, there is provided a solid state imaging apparatus including:

an optical film layer on which a solid state image sensor is mounted;

a multifunctional chip laminated at a periphery of the solid state image sensor in the optical film layer being electrically connected to the optical film layer via a metal body;

a sealing resin layer for sealing the periphery where the multifunctional chip is laminated on the optical film layer; and a concave structure for blocking a flow of the sealing resin in a liquid state when the sealing resin layer is formed at the periphery of the sealing resin layer.

The concave structure for blocking a flow can be a scoop portion configured by scooping a surface surrounding the periphery of the multifunctional chip.

The concave structure for blocking a flow can be configured by multiply surrounding the multifunctional chip.

The concave structure for blocking a flow can be formed by scooping only the optical film layer by dry etching in a wafer production step.

An inner wall of the concave structure for blocking a flow can be scooped surrounding the periphery of the optical film layer at a tilt angle of about 60 to 90 degrees to a surface of the optical film layer.

The optical film layer can have different shapes on a wiring and between wirings formed by the scoop portion of the optical film layer.

The scoop portion of the optical film layer has a pattern surrounding the periphery of the multifunctional chip laminated.

According to an embodiment of the present technology, there is provided a method of producing a solid state imaging apparatus including an optical film layer on which a solid state image sensor is mounted; a multifunctional chip laminated at a periphery of the solid state image sensor in the optical film layer being electrically connected to the optical film layer via a metal body; a sealing resin layer for sealing the periphery where the multifunctional chip is laminated on the optical film layer; and a concave structure for blocking a flow of the sealing resin in a liquid state when the sealing resin layer is formed at the periphery of the sealing resin layer, including:

forming the optical film layer;

forming a concave structure for blocking a flow to surround a periphery of the multifunctional chip laminated;

laminating the multifunctional chip on the optical film layer; and applying and curing the sealing resin to form the sealing resin layer surrounded by the multifunctional chip.

According to an embodiment of the present technology, there are formed a multifunctional chip laminated at a periphery of the solid state image sensor in the optical film layer being electrically connected to the optical film layer via a metal body; and a concave structure for blocking a flow of a sealing resin at a periphery of a sealing resin layer for sealing the periphery of the multifunctional chip laminated in the optical film layer being electrically connected to the optical film layer via the metal body at the periphery of the solid state image sensor.

According to an embodiment of the present technology, a size of the solid state image sensor in the solid state imaging apparatus can be reduced, and the optical properties can be inhibited from decreasing by the stray light reflected.

These and other objects, features and advantages of the present technology will become more apparent in light of the following detailed description of best mode embodiments thereof, as illustrated in the accompanying drawings.

BRIEF DESCRIPTION OF DRAWINGS

FIGS. 6A and 6B each is a view for illustrating a difference in a stray light between a general solid state. image sensor chip and a solid state image sensor chip according to an embodiment of the present technology;

DETAILED DESCRIPTION OF EMBODIMENTS

Hereinafter, an embodiment of the present technology will be described with reference to the drawings.

Figure 1A:
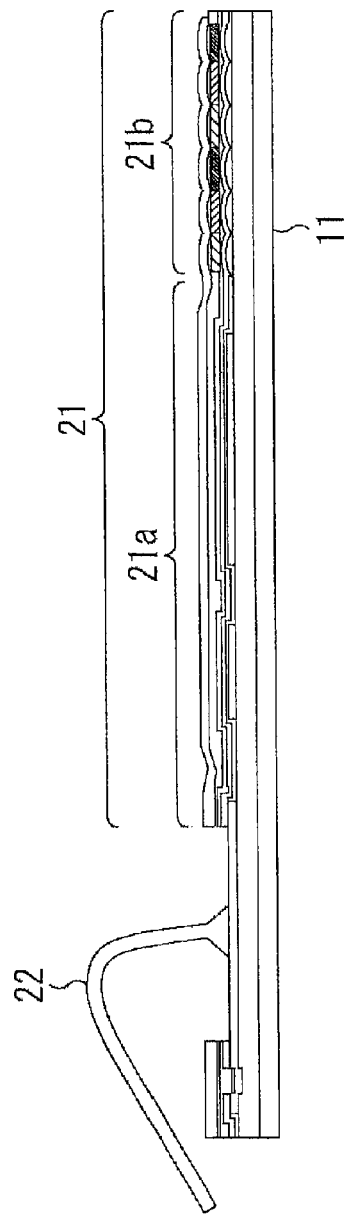
FIGS. 1A and 1B each is a view for illustrating a configuration embodiment of a general solid state image sensor chip.
Figure 1B:
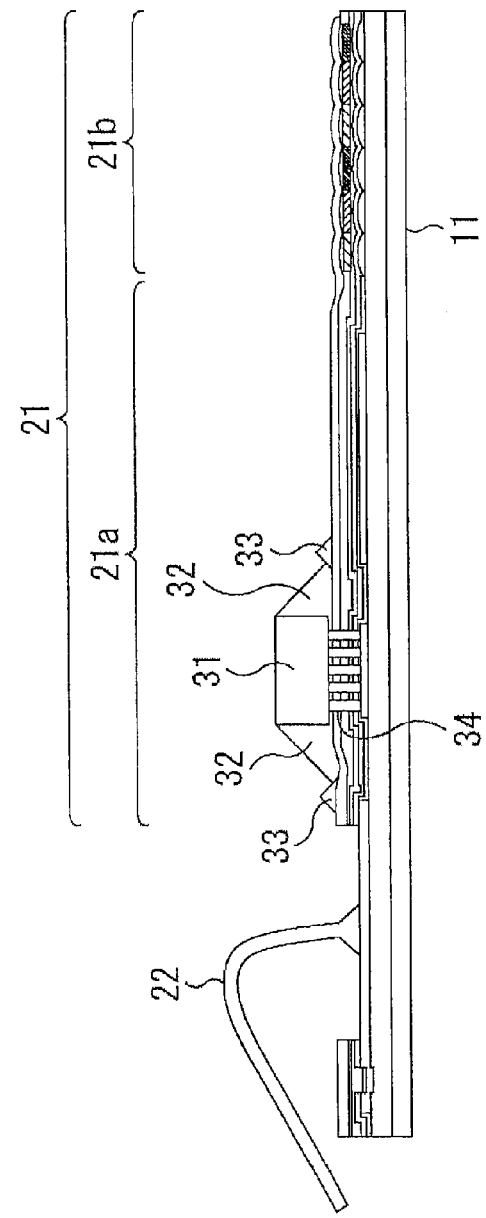

FIGS. 1A and 1B each shows a side cross-sectional view for simulating a configuration of a general solid state image sensor chip used in a solid state imaging apparatus.

As shown in FIG. 1A, the general solid state image sensor chip includes silicon (Si) and a wiring 11 on the silicon, a peripheral circuit region 21a and an optical pixel region 21b constituting a solid state image sensor 21 as an optical film layer disposed thereon, and a wire bond region where a wire 22 for outputting an pixel signal generated from the image sensor disposed on the optical pixel region 21b is connected. In the optical pixel region 21b, each image sensor is disposed per pixel, and each color filter RGB (Red, Green, Blue) and each on-chip lens are disposed thereon. Each image sensor generates a pixel signal by photoelectric conversion once an incident light is received, and outputs the pixel signal to a signal processing circuit disposed at the peripheral circuit region 21a. The peripheral circuit region 21a includes the signal processing circuit for carrying out a predetermined processing of the pixel signal supplied from the image sensor disposed on the optical pixel region 21b per pixel. The signal processing circuit carries out a variety of processes to the pixel signal, and outputs the pixel signal via the wire 22 bonded at the wire bond region.

As a recent progress in a signal processing technology, a demand for carrying out a more advanced and complex signal processing is increased in a pixel signal. However, when a two dimensional circuit is formed on the peripheral circuit region 21a, a more wider flat space and a complex configuration are physically necessary in order to carry out the more advanced and complex signal processing. In order to provide a large and complex circuit, a far wider peripheral circuit region 21a is necessary. As a result, a whole solid state image sensor chip may be grown in size. In addition, the method of producing the whole solid state image sensor includes a process for configuring each image sensor at the peripheral circuit region 21a and a process for configuring each circuit at the peripheral circuit region 21a. Thus, a production yield may be decreased.

In order to provide a large and complex circuit on the peripheral circuit region 21a, to reduce a two dimensional space and to improve the production yield, it has been proposed that a multifunctional chip 31 including a signal processing circuit produced by a separate step is laminated on the peripheral circuit region 21a, as shown in FIG. 1B.

Specifically, in FIG. 1B, the multifunctional chip 31 produced in a three dimension form by the separate step is laminated in the peripheral circuit region 21a instead of the two dimensional signal processing circuit. The multifunctional chip 31 is electrically connected to the peripheral circuit region 21a via a metal wiring 34, carries out a predetermined processing to a pixel signal supplied from the image sensor disposed at the optical pixel region 21b, and outputs the pixel signal via the wire 22 bonded at the wire bond region.

In more detail, the multifunctional chip 31 is sealed with a sealing resin layer 32 therearound, and the metal wiring 34 is housed therein. Furthermore, a convex structure 33 for blocking a flow that is necessary for an injection of the sealing resin is disposed around and surrounds the sealing resin layer 32. The convex structure 33 for blocking a flow functions as a dam structure for damming the flow of the sealing resin while the sealing resin is injected in a liquid state and is cured. As a result, the convex structure 33 for blocking a flow prevents the sealing resin in a liquid state from diffusing and contaminating the optical pixel region 21b in the production step until the liquid sealing resin is cured.

In this manner, the multifunctional chip 31 is laminated at the peripheral circuit region 21a. The peripheral circuit region 21a requires no more space so long as an area for laminating the multifunctional chip 31 is ensured. It is possible to reduce a total size of the solid state image sensor even if the circuit configuration becomes complex.

However, when the multifunctional chip 31 is laminated in the peripheral circuit area 21a, 50 µm is necessary for disposing the convex structure 33 for blocking a flow as a space (a width of the convex structure 33 for blocking a flow) for disposed in the convex structure 33 for blocking a flow. In addition, as a placement accuracy, ±30 µm is necessary and, as a width accuracy, ±10 µm is necessary, for example. In summary, about 90 µm of a width (=(50+10+30) µm) is necessary in total for the convex structure 33 for blocking a flow per line. Thus, as a total size of the multifunctional chip 31 and the flow blocking structure is essential, the solid state image sensor chip cannot be smaller anymore.

As the convex structure 33 for blocking a flow is disposed near the optical pixel region 21b but is projected from a surface of the peripheral circuit region 21a, a part of the incident light is reflected to produce a so-called reflection stray light. The stray light is incident on the image sensor disposed at the optical pixel region 21b. Thus, the optical properties of the solid state image sensor are decreased.

[Structure of Solid State Image Sensor Chip to which the Present Technology is Applied]

Figure 2:
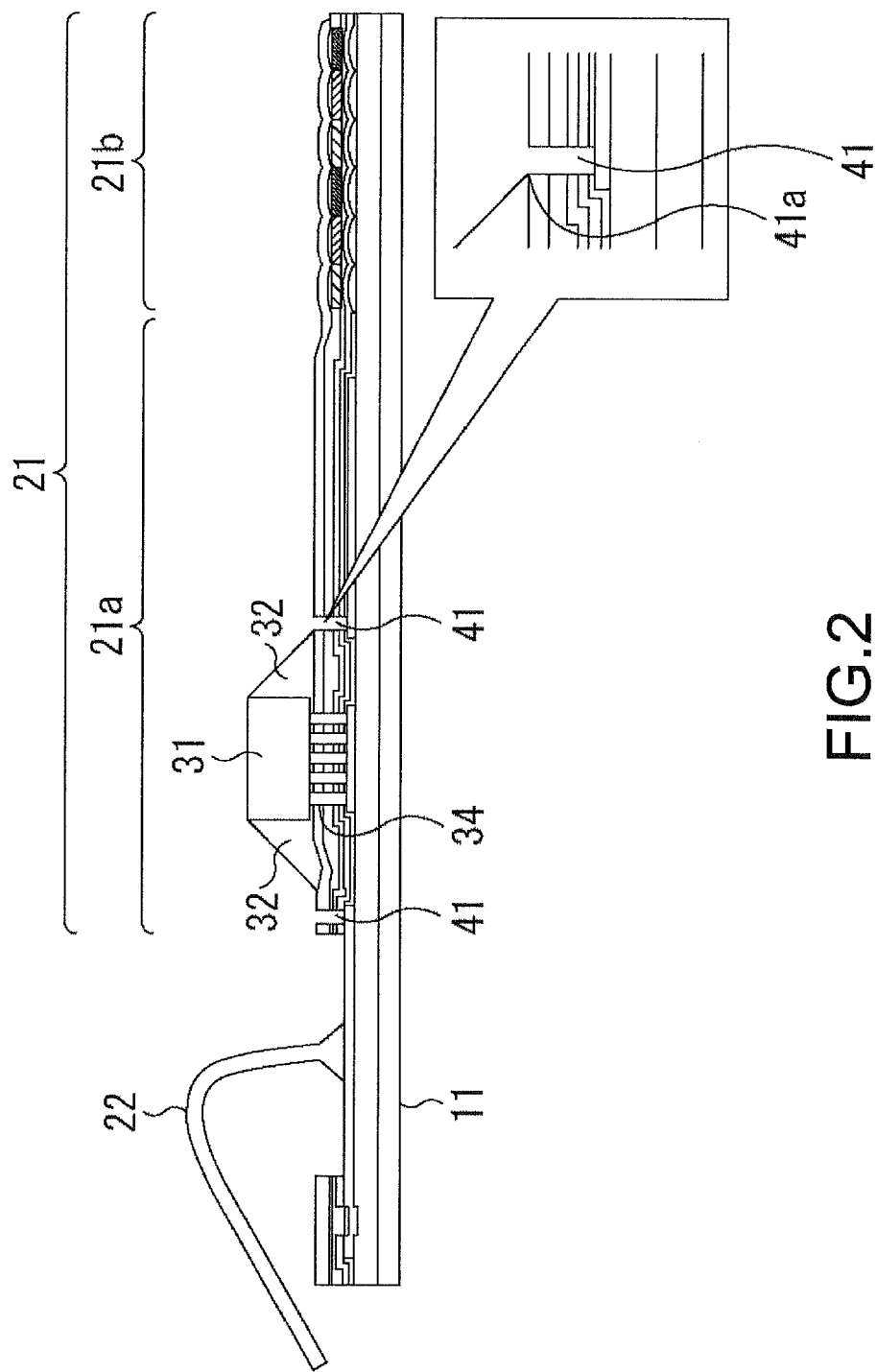
FIG. 2 is a view for illustrating a configuration embodiment of a solid state image sensor chip according to an embodiment of the present technology.

FIG. 2 is a view for illustrating a configuration embodiment of a solid state image sensor chip used in a solid state imaging apparatus to which the present technology is applied. Specifically, as described above, in the solid state image sensor chip to which the present technology is applied, as shown in FIG. 2, a concave structure 41 for blocking a flow is disposed instead of the convex structure 33 for blocking a flow. In FIG. 2, configurations having the same functions as those in FIG. 1 are denoted by the same names and reference numerals, and thus detailed description thereof will be hereinafter omitted.

In other words, as shown in FIG. 2, in the solid state image sensor chip to which the present technology is applied, the concave structure 41 for blocking a flow is disposed instead of the convex structure 33 for blocking a flow.

The concave structure 41 for blocking a flow is a scoop portion disposed surrounding the multifunctional chip 31 in the peripheral circuit region 21a, as shown in a lower right view of FIG. 2. The scoop portion of the concave structure 41 for blocking a flow has a tilt angle 41a to the surface of the peripheral circuit region 21a of about 60 to 90 degrees. The scoop portion of the concave structure 41 for blocking a flow can have the tilt angle 41a to the surface of the peripheral circuit region 21a of 90 degrees by scooping by dry etching in a wafer production step.

By configuring in this manner, in a step of forming the sealing resin layer 32, the sealing resin to be diffused flows into the scoop portion of the concave structure 41 for blocking a flow until the sealing resin in a liquid state is cured. As a result, as the sealing resin in a liquid state does not flow outside a range surrounded by the concave structure 41 for blocking a flow until curing, it is possible to inhibit an outflow of the sealing resin and contamination of the optical pixel region 21b by the sealing resin.

Figure 3:
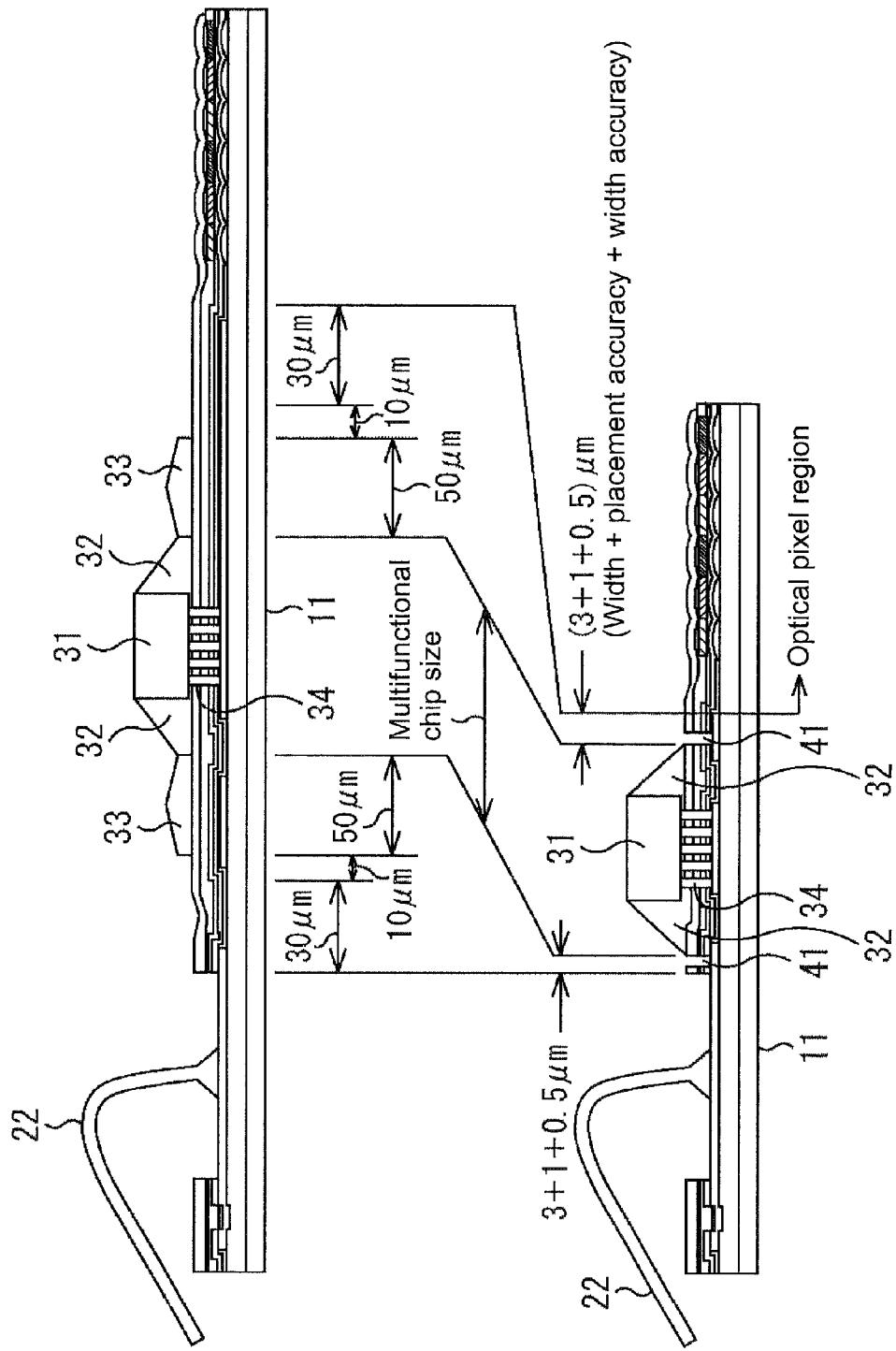
FIG. 3 is a view for illustrating a small sized solid state image sensor according to an embodiment of the present technology.

As shown in FIG. 3, a width of the scoop portion for the concave structure 41 for blocking a flow may be about 3 µm as opposed to that of the convex structure 33 for blocking a flow is 50 µm, for example. In this way, the necessary width can be 1/10 or less. As the concave structure 41 for blocking a flow can be produced by dry etching in a wafer production step, a placement accuracy can be about 1 µm and a width accuracy can be about 0.5 µm. As a result, a necessary space width will be 4.5 µm (=(3+1+0.5) µm) per line in addition to the width of the solid state image sensor chip. Thus, the width necessary for laminating the multifunctional chip 31 can be reduced 90% or more excluding the width of the multifunctional chip 31.

[Distance from Multifunctional Chip to Flow Blocking Structure]

Figure 4:
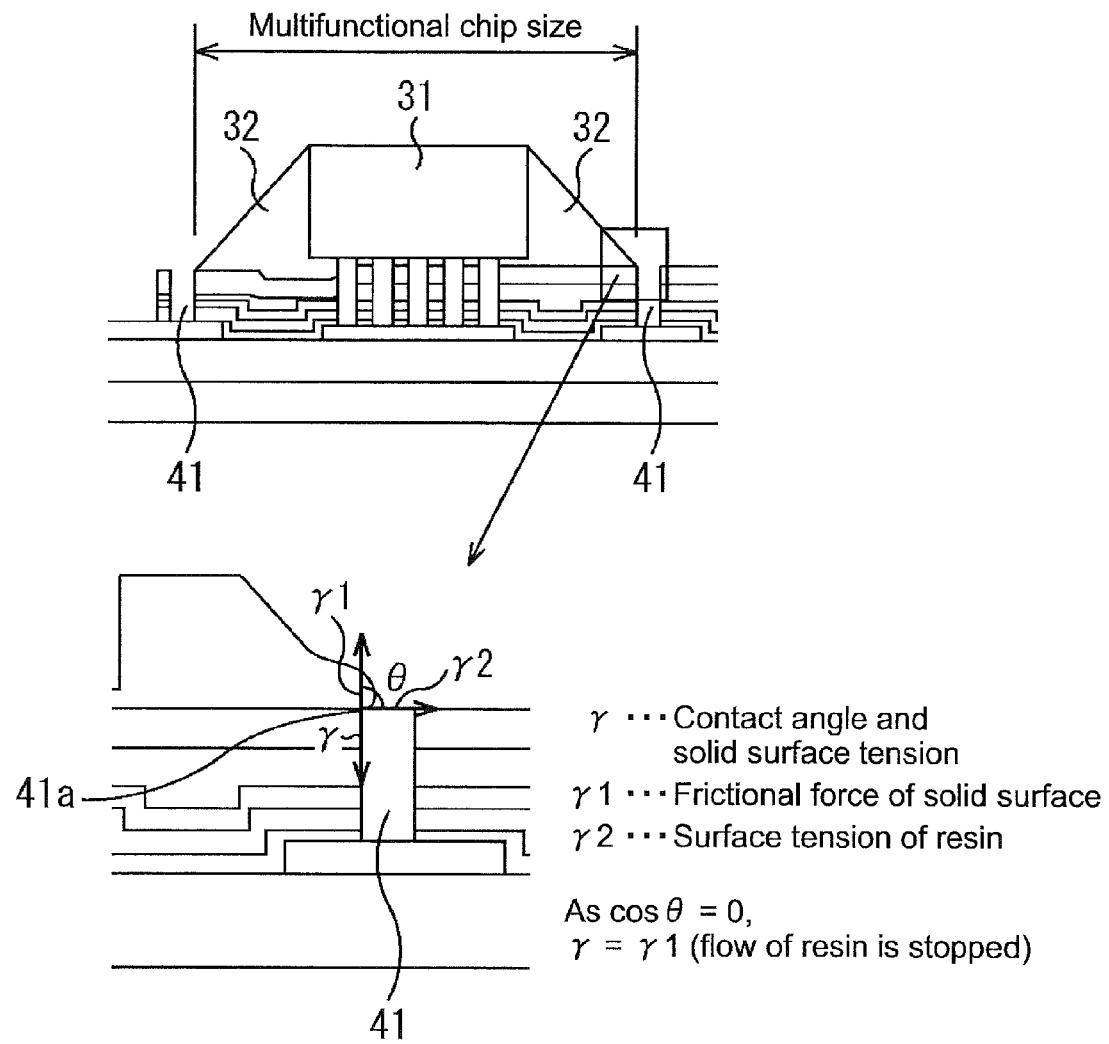
FIG. 4 is a view for illustrating conditions for blocking a flow of a sealing resin in view of a relationship between a coating amount of a sealing resin and a distance from a multifunctional chip to a flow blocking structure.

By using the concave structure 41 for blocking a flow, it is possible to reduce a distance from an end of the multifunctional chip 31 to a position of the concave structure 41 for blocking a flow. In other words, as shown in an upper part of FIG. 4, the concave structure 41 for blocking a flow is disposed for the sealing resin layer 32. In a lower part of FIG. 4, there are shown a corner 41a (hereinafter referred to as an angle 41a of the scoop portion) at an end of the concave structure 41 for blocking a flow, and a contact angle θ between a surface of the peripheral circuit region 21a and the sealing resin (in a liquid state) before curing. At the contact angle θ, a surface tension γ of the peripheral circuit region 21a equals to a sum of a frictional force γ1 of the angle 41a of the scoop portion and a surface tension γ2 of the sealing resin before curing x cosθ. Accordingly, when the contact angle θ=90 degrees, cosθ=0. Then, the surface tension γ2 of the sealing resin before curing is 0. As the surface tension γ of the peripheral circuit region 21a equals to the frictional force γ1 of the angle 41a of the scoop portion, the sealing resin before curing does not flow into the concave structure 41 for blocking a flow.

Figure 5:
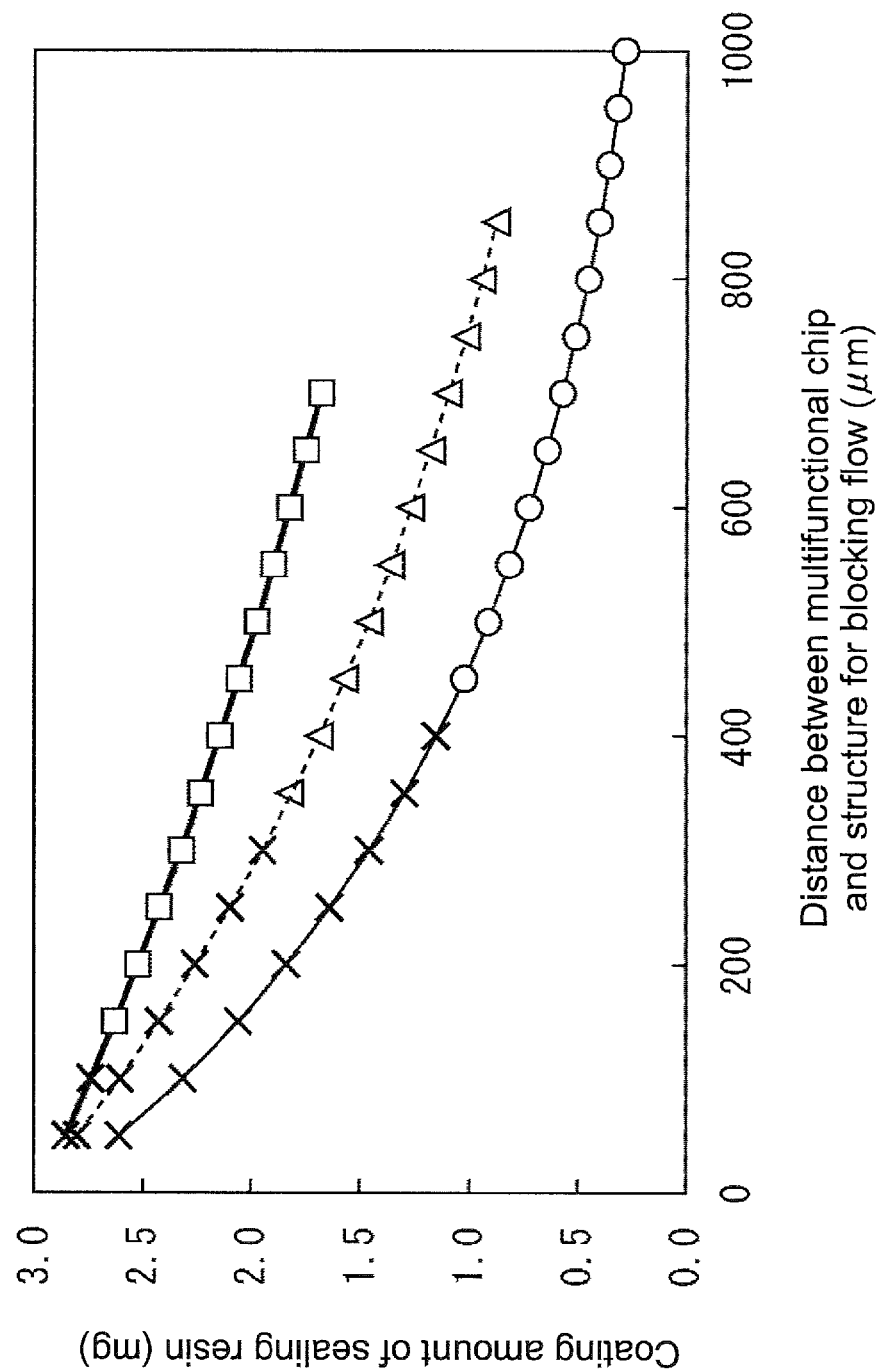
FIG. 5 is a graph showing a relationship between a coating amount of a sealing resin and a distance from a multifunctional chip to a flow blocking structure.

Based on the above description, FIG. 5 shows a relationship between a distance from the end of the multifunctional chip 31 to the structure for blocking a flow and a maximum coating amount of the sealing resin not exceeding the structure for blocking a flow, when a surface of a test chip is formed of silicon oxide ($SiO_2$) and after the sealing resin is cured. In FIG. 5, square marks represent the relationship between a distance from the end of the multifunctional chip 31 to the concave structure 41 for blocking a flow according to an embodiment of the present technology and a coating amount of the sealing resin not exceeding the concave structure 41 for blocking a flow. The sample used is a resin having a viscous property of a contact angle of 10 to 12 degrees on a surface of silicon nitride (SiN) at 25° C. Circle marks represent the relationship between a distance from the end of the multifunctional chip 31 to the convex structure 33 for blocking a flow and the coating amount of the sealing resin not exceeding the convex structure 33 for blocking a flow, when other sample resin having a viscous property of a contact angle of 15 to 16 degrees on the surface. Cross marks represent that the sealing resin exceeded the structure for blocking a flow to contaminate the optical pixel region 21b.

As shown in the square marks in FIG. 5, when the concave structure 41 for blocking a flow is used, the sealing resin does not overflow at the distance from the end of the multifunctional chip 31 and the concave structure 41 for blocking a flow of less than 200 µm even though the coating amount of the resin exceeds 2.5 mg. On the other hand, when the convex structure 33 for blocking a flow represented by the triangle and circle marks is used, the distance from the end of the multifunctional chip 31 to the convex structure 33 for blocking a flow is limited to about 400 µm, and the coating amount of the sealing resin is limited to about 0.2 mg. Accordingly, if the distance from the end of the multifunctional chip 31 to the concave structure 41 for blocking a flow is decreased and the coating amount of the sealing resin is increased, the sealing resin will not exceed the concave structure 41 for blocking a flow and the optical pixel region 21b will be therefore not contaminated. It is possible to decrease the area itself necessary for laminating the multifunctional chip 31. As a result, a small sized solid state image sensor can be provided.

[Effects on Reflection Stray Light]

Figures 6, 6B:
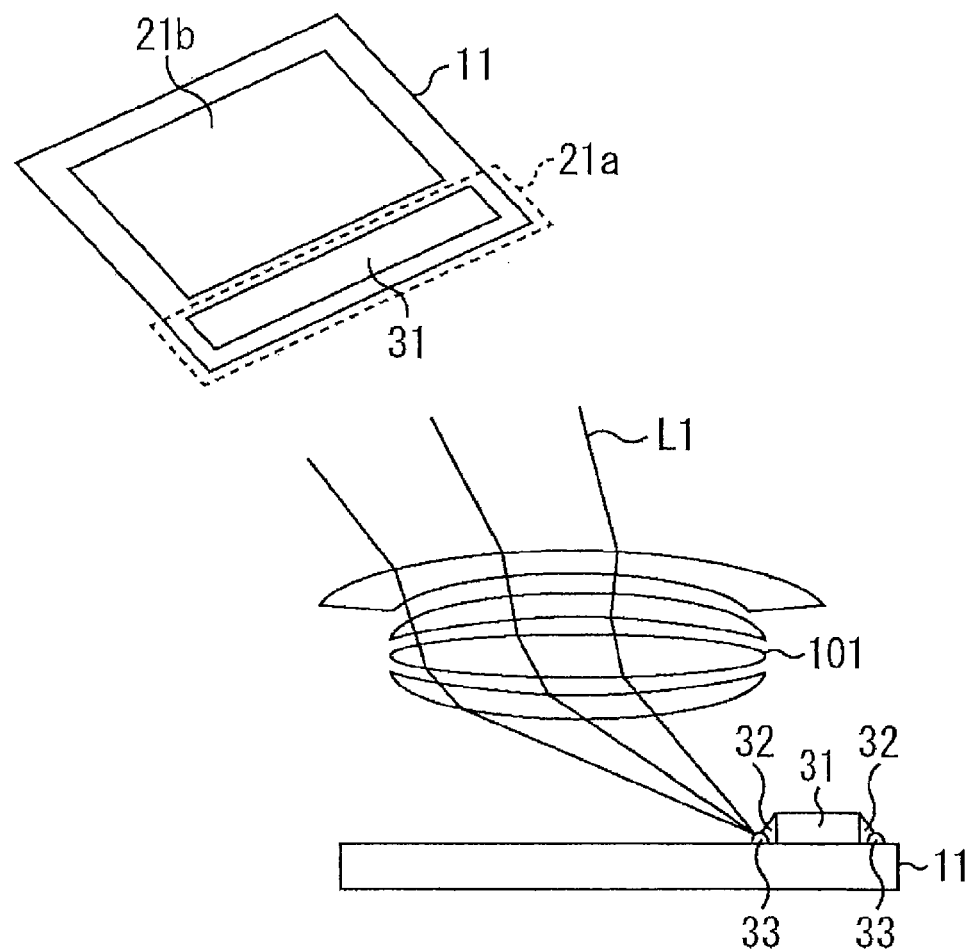
Figure 7A:
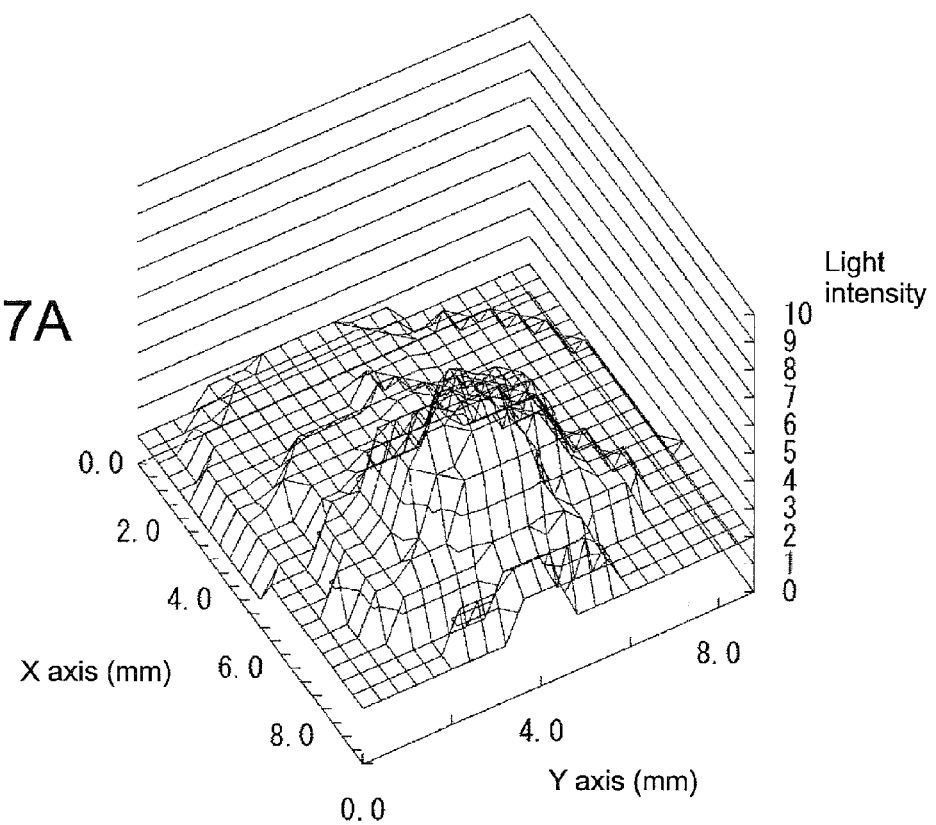
FIGS. 7A and 7B each is a 3D graph for illustrating a difference in a stray light between a general solid state image sensor chip and a solid state image sensor chip according to an embodiment of the present technology.
Figure 7B:
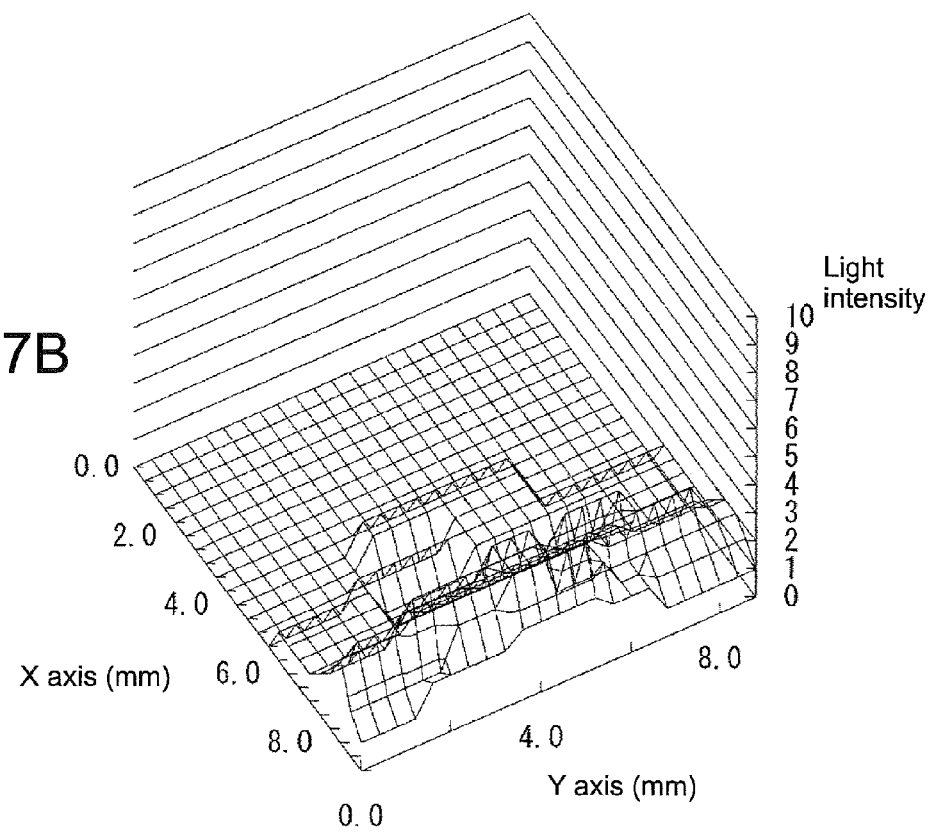

As shown in FIG. 6A, the peripheral circuit region 21a is disposed adjacent to the optical pixel region 21b, and the multifunctional chip 31 is laminated within the peripheral circuit region 21a. FIGS. 7A and 7B show light intensity distributions (irradiance distributions) of a stray light of the optical pixel region 21b using the convex structure 33 for blocking a flow and the concave structure 41 for blocking a flow.

FIGS. 7A and 7B show light intensity distributions (irradiance distributions) in respective coordinates where the optical pixel area 21b is represented by an XY plane, when light beams L1 are emitted from a halogen light source and are transmitted through a lens group 101 to irradiate the solid state image sensor chip. FIG. 7A shows the distribution where the convex structure 33 for blocking a flow is used. In this case, the convex structure 33 for blocking a flow is formed of a metal material (Sn) in a semispherical shape having a diameter of 50 µm, as shown in an upper part of FIG. 6B. On the other hand, FIG. 7B shows the distribution where the concave structure 41 for blocking a flow is used. In this case, the concave structure 41 for blocking a flow is formed as the scoop portion having a width of 3 µm and a depth of 1 µm, as shown in a lower part of FIG. 6B. In either case, a shortest distance from the end of the multifunctional chip 31 to an effective pixel in the optical pixel region 21b is 50 µm.

In the distribution shown in FIG. 7A where the convex structure 33 for blocking a flow is used, a strong peak appears around a center of the optical pixel region 21b, which reveals that a reflection stray light is detected at all over the optical pixel region 21b. In contrast, in the distribution shown in FIG. 7B where the concave structure 41 for blocking a flow is used, it reveals that no reflection stray light is detected at about half of the optical pixel region 21b. From the comparison, by using the concave structure 41 for blocking a flow, it is apparent that the reflection stray light is decreased, as a whole. As to a depth of the scoop portion in the concave structure 41 for blocking a flow, effects on wiring may be considered such that the depth may be changed depending on a wiring position, i.e., on a wiring or between wirings.

[Production Process]

Figure 8:
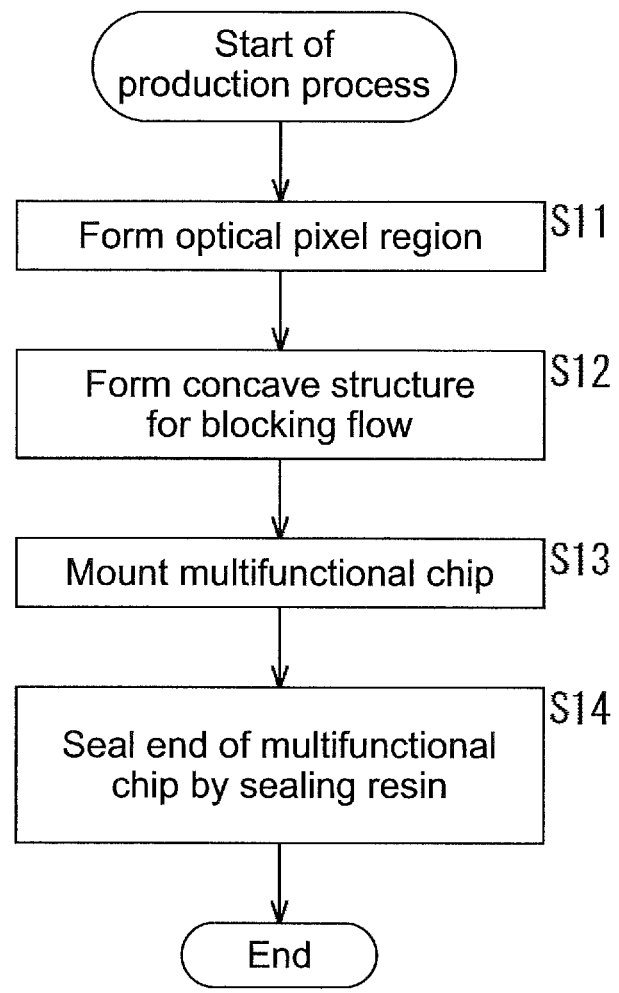
FIG. 8 is a flow chart for illustrating a method of producing a solid state image sensor chip according to an embodiment of the present technology.

Next, referring to a flow chart shown in FIG. 8, a method of producing a solid state image sensor chip having the concave structure 41 for blocking a flow will be described.

In a step S11, the optical pixel region 21b is formed.

In a step S12, the concave structure 41 for blocking a flow is formed by dry etching to form the scoop portion such that an area where the multifunctional chip 31 is laminated is surrounded.

In a step S13, the multifunctional chip 31 is laminated on the peripheral circuit region 21a in a state that the multifunctional chip 31 is electrically connected to the peripheral circuit region 21a via the metal wiring 34.

In a step S14, the sealing resin is applied to an area surrounded by the multifunctional chip 31 laminated on the peripheral circuit region 21a and the concave structure 41 for blocking a flow disposed surrounding the multifunctional chip 31, and is dammed by the concave structure 41 for blocking a flow. In this way, the sealing resin is filled, and cured by irradiating ultraviolet rays or applying an auxiliary heat to form the sealing resin layer 32.

Through the steps as described above, the solid state image sensor chip having the concave structure 41 for blocking a flow shown in FIG. 2 is produced.

Although it is described that only one concave structure 41 for blocking a flow surrounds the multifunctional chip 31, a plurality of concave structures 41 for blocking a flow having the same configuration may surround multiply the multifunctional chip 31. In this way, even if the coating amount of the sealing resin for the sealing resin layer 32 is further increased, it can prevent the sealing resin from diffusing until the sealing resin is cured. Thus, the contamination of the optical pixel region 21b can be certainly prevented.

In the solid state image sensor chip having the concave structures 41 for blocking a flow produced through the above-described steps shown in FIG. 2, the space for blocking a flow can be reduced, thereby reducing the size. For example, when the solid image sensor for forming the optical pixel region 21b has a size of 11×11 mm and the multifunctional chip 31 has a size of 1.5×10 mm, the space can be reduced by about 4%.

As the distance from the multifunctional chip 31 to the optical pixel region 21b can be reduced, a mounted area of the multifunctional chip 31 can be reduced. For example, when the multifunctional chip 31 has a size of 1.5×10 mm, a combined value of a placement accuracy, a width accuracy and a width of the concave structure for blocking a flow can be reduced by about 3%.

Furthermore, as the size of each solid state image sensor chip can be reduced, the number of the solid state image sensor chips produced from one wafer can be increased to improve a production efficiency and decrease the costs. For example, when the solid state image sensor has a size of 11×11 mm, the number of the solid state image sensor chips can be increased by 3.2% in a 300 mm wafer as compared to that in the related art. Similarly, when the solid state image sensor chip has a size of 6×6 mm, the number can be increased by 6.2%.

In addition, as the concave structure for blocking a flow has the contact angle of the sealing resin greater than that of the convex structure for blocking a flow, it is possible to a greater tolerance can be set about a coating amount variability of the sealing resin. For example, in the concave structure for blocking a flow, the tolerance for the coating amount variability is about 10%, but in the convex structure for blocking a flow, the tolerance for the coating amount variability can be about 20%.

Still further, the reflection stray light to be incident can be decreased from the flow block to the optical pixel region, thereby providing a higher image quality.

The present technology may have the following configurations.

(1) A solid state imaging apparatus, including:

an optical film layer on which a solid state image sensor is mounted;

a multifunctional chip laminated at a periphery of the solid state image sensor in the optical film layer being electrically contacted with the optical film layer via a metal body;

a sealing resin layer for sealing the periphery where the multifunctional chip is laminated on the optical film layer; and a concave structure for blocking a flow of the sealing resin in a liquid state when the sealing resin layer is formed at the periphery of the sealing resin layer.

(2) The solid state imaging apparatus according to (1) above, in which the concave structure for blocking a flow is a scoop portion configured by scooping a surface surrounding the multifunctional chip.

(3) The solid state imaging apparatus according to (2) above, in which the concave structure for blocking a flow is configured by multiply surrounding the multifunctional chip.

(4) The solid state imaging apparatus according to (2) above, in which the concave structure for blocking a flow is formed by scooping only the optical film layer by dry etching in a wafer production step.

(5) The solid state imaging apparatus according to (2) above, in which an inner wall of the concave structure for blocking a flow is scooped surrounding the periphery of the optical film layer at a tilt angle of about 60 to 90 degrees.

(6) The solid state imaging apparatus according to (1) above, in which the optical film layer has different shapes on a wiring and between wirings formed by the scoop portion of the optical film layer.

(7) The solid state imaging apparatus according to (1) above, in which the scoop portion of the optical film layer has a pattern surrounding the multifunctional chip laminated.

(8) A method of producing a solid state imaging apparatus including an optical film layer on which a solid state image sensor is mounted; a multifunctional chip laminated at a periphery of the solid state image sensor in the optical film layer being electrically contacted with the optical film layer via a metal body; a sealing resin layer for sealing the periphery where the multifunctional chip is laminated on the optical film layer; and a concave structure for blocking a flow of the sealing resin in a liquid state when the sealing resin layer is formed at the periphery of the sealing resin layer, including:

forming the optical film layer;

forming a concave structure for blocking a flow to surround a periphery of the multifunctional chip laminated;

laminating the multifunctional chip on the optical film layer; and applying and curing the sealing resin to form the sealing resin layer surrounded by the multifunctional chip.

It should be understood by those skilled in the art that various modifications, combinations, sub-combinations and alterations may occur depending on design requirements and other factors insofar as they are within the scope of the appended claims or the equivalents thereof.

What is claimed is:

1. A solid state imaging apparatus comprising:
    an optical film layer on which a solid state image sensor is mounted;
    a multifunctional chip laminated at a periphery of the solid state image sensor in the optical film layer, the multifunctional chip electrically contacts the optical film layer via a metal body;
    a sealing resin layer formed with a sealing resin, the sealing resin layer for sealing the periphery where the multifunctional chip is located on the optical film layer; and
    a concave structure configured to retain a flow of the sealing resin in a liquid state at the periphery of the solid state image sensor.

2. The solid state imaging apparatus according to claim 1, wherein
    the concave structure is configured to retain the flow is a scoop portion configured by a scooping surface that surrounds the multifunctional chip.

3. The solid state imaging apparatus according to claim 1, further comprising
    a plurality of concave structures including the concave structure that are configured to retain the flow.

4. The solid state imaging apparatus according to claim 1, wherein
    the concave structure is configured to retain the flow is formed by scooping only the optical film layer with dry etching in a wafer production step.

5. The solid state imaging apparatus according to claim 2, wherein
    an inner wall of the concave structure configured to retain the flow has the scooping surface with a tilt angle of about 60 to 90 degrees.

6. The solid state imaging apparatus according to claim 1, wherein
    the optical film layer has different shapes on a wiring and between wirings formed by a scoop portion of the optical film layer.

7. The solid state imaging apparatus according to claim 6, wherein
    the scoop portion of the optical film layer has a pattern that surrounds the multifunctional chip.

8. A method of producing a solid state imaging apparatus, the method comprising:
    forming an optical film layer;
    mounting a solid state image sensor on the optical film layer;
    forming a concave structure that is configured to retain a flow of a sealing resin in a liquid state at a periphery of the solid state image sensor;
    laminating a multifunctional chip at the periphery of the solid state image sensor on the optical film layer by applying and curing the sealing resin to form a sealing resin layer to seal the periphery where the multifunctional chip is located.

9. The method of producing a solid state imaging apparatus according to claim 8, wherein
    the concave structure is configured to retain the flow is a scoop portion configured by a scooping surface that surrounds the multifunctional chip.

10. The method of producing a solid state imaging apparatus according to claim 8, further comprising
    forming a plurality of concave structures including the concave structure that are configured to retain the flow.

11. The method of producing a solid state imaging apparatus according to claim 8, wherein
    the concave structure is configured to retain the flow is formed by scooping only the optical film layer with dry etching in a wafer production step.

12. The method of producing a solid state imaging apparatus according to claim 9, wherein
    an inner wall of the concave structure is configured to retain the flow has the scooping surface with a tilt angle of about 60 to 90 degrees.

13. The method of producing a solid state imaging apparatus according to claim 8, wherein
    the optical film layer has different shapes on a wiring and between wirings formed by a scoop portion of the optical film layer.

14. The method of producing a solid state imaging apparatus according to claim 13, wherein
    the scoop portion of the optical film layer has a pattern that surrounds the multifunctional chip.

15. A solid state imaging apparatus, comprising:
    an optical film layer having a solid state image sensor, the solid state image sensor having an optical pixel region and a peripheral region;
    one or more image sensors disposed in the optical pixel region;
    a multifunctional chip disposed in the peripheral region and in electrical contact with the one or more image sensors by a metal wiring;
    a concave structure disposed in the peripheral region and configured to retain a flow of sealing resin in a liquid state in the peripheral region; and
    a sealing resin layer that seals the multifunctional chip disposed in the peripheral region.

* * * * *